United States Patent
Shibata

(10) Patent No.: US 9,081,069 B2
(45) Date of Patent: Jul. 14, 2015

(54) PROTECTION IC AND METHOD OF MONITORING A BATTERY VOLTAGE

(71) Applicant: Kohei Shibata, Tokyo (JP)

(72) Inventor: Kohei Shibata, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/157,594

(22) Filed: Jan. 17, 2014

(65) Prior Publication Data

US 2014/0210612 A1    Jul. 31, 2014

(30) Foreign Application Priority Data

Jan. 31, 2013  (JP) ................................. 2013-016534

(51) Int. Cl.
*G08B 19/00* (2006.01)
*G01R 31/36* (2006.01)
*G01R 19/165* (2006.01)

(52) U.S. Cl.
CPC ...... *G01R 31/3658* (2013.01); *G01R 19/16542* (2013.01); *G01R 31/362* (2013.01)

(58) Field of Classification Search
CPC ..................... G01R 19/16542; G01R 31/3658; G01R 31/362; H01M 2/34; H01M 10/425; H01M 10/48; H01M 2200/00; H01M 2200/103; H02J 7/0021
USPC ................. 340/521, 522, 635, 636.1, 636.12, 340/636.13, 636.17, 652, 657, 662; 320/116, 134, 136, 150; 307/18, 43, 307/130; 324/123 R, 426, 433, 434
See application file for complete search history.

(56) References Cited

U.S. PATENT DOCUMENTS

| | | | |
|---|---|---|---|
| 2006/0220461 A1* | 10/2006 | Miyamoto | 307/43 |
| 2009/0079396 A1 | 3/2009 | Osamura | |
| 2010/0052656 A1* | 3/2010 | Tanaka et al. | 324/123 R |
| 2010/0289497 A1* | 11/2010 | Lum-Shue-Chan et al. | 324/426 |
| 2011/0149454 A1* | 6/2011 | Shibuya et al. | 361/87 |
| 2012/0112755 A1 | 5/2012 | Nishizawa et al. | |
| 2012/0175953 A1* | 7/2012 | Ohkawa et al. | 307/18 |
| 2013/0057293 A1* | 3/2013 | Miyamoto | 324/433 |

FOREIGN PATENT DOCUMENTS

| | | |
|---|---|---|
| JP | 2009-095222 | 4/2009 |
| JP | 2012-098238 | 5/2012 |

\* cited by examiner

*Primary Examiner* — Anh V La
(74) *Attorney, Agent, or Firm* — IPUSA, PLLC

(57) ABSTRACT

A protection IC connected to cell groups of a secondary battery assembly of a secondary battery connected in series and monitoring battery voltages of the cells in the cell groups, including terminals connected to connection points of the cells in the cell groups and both ends of the cell groups; a first alarm generating portion detecting an overvoltage by comparing voltages of the cells of the cell groups on both ends of the cells and generates the first alarm signal; and a second alarm generating portion detecting disconnection in connection points of the cells and disconnection between the connection points of the cell groups and the both ends and the terminals by detecting voltage drop or current decrement at the connection points of the cells of the cell groups and at one end of the cell groups in the cells, and generates a second alarm signal.

6 Claims, 2 Drawing Sheets

PROTECTION IC AND METHOD OF MONITORING A BATTERY VOLTAGE

CROSS-REFERENCE TO RELATED APPLICATIONS

This patent application is based upon and claims the benefit of priority of Japanese Patent Application No. 2013-016534, filed on Jan. 31, 2013, the entire contents of which are incorporated herein by reference.

BACKGROUND OF THE INVENTION

1. Field of the Invention

The present invention relates to a protection IC and a method of monitoring a battery voltage.

2. Description of the Related Art

In recent years, a lithium ion battery, which is one of secondary batteries, is being installed in a mobile device such as a digital camera. The lithium ion battery is vulnerable to an overcharge and an overdischarge. Therefore, it is necessary to provide a protection circuit, for example a protection integrated circuit (IC), in the lithium ion battery.

In a case where a plurality of cells of the lithium ion battery are connected in series and used, a disconnection between the cells and the protection IC needs to be avoided in order to properly detect an overcharge voltage of the cells of the lithium ion battery. If there is a disconnection, an accurate detection of the overcharge voltage is not performed, which may require a control such as prohibition of charge.

Japanese Laid-open Patent Publication No. 2009-95222 proposes that a detection current greater than a consumption current, which flows through various voltage monitoring circuits under a normal state, is flown through connection lines between cells and the voltage monitoring circuits when a disconnection is detected, a path through which a detection current flows is changed by a diode so that a corresponding potential relation between connection lines on positive and negative sides is changed when the disconnection occurs, and an inversion detection circuit detects the inversion of the potential relation, and a disconnection detection signal is output.

Japanese Laid-open Patent Publication No. 2012-98238 discloses a technique that a disconnection in a connecting portion between an electrode terminal of a battery pack and a power source terminal of a battery voltage monitoring circuit is detected.

SUMMARY OF THE INVENTION

For example, there is a problem, in a case where a plurality of cells of a lithium ion battery are connected in series as a cell group and a plurality of cell groups are further connected in series and used, that a disconnection in connections between the plurality of cell groups and the protection IC may not be detected.

Embodiments of the present invention are provided in consideration of the above. An exemplary object of the embodiments is to provide a protection IC, which can detect a disconnection between the cell groups and the protection IC at a position where the cell groups are connected in series, and a method of monitoring a battery voltage.

According to an aspect of the present invention, there is provided a protection IC which is connected to cell groups of a secondary battery assembly formed by connecting a plurality of cell groups, in which a plurality of cells of a secondary battery are connected in series, and monitors battery voltages of the plurality of cells in the cell groups, including a plurality of terminals which are connected to connection points of the plurality of cells in the cell groups and both ends of the cell groups; a first alarm generating portion which detects an overvoltage by comparing voltages of the plurality of cells of the cell groups on both ends of the plurality of cells and generates the first alarm signal; and a second alarm generating portion which detects disconnection in connection points of the plurality of cells of the cell groups and disconnection between the connection points of the plurality of cells of the cell groups and the both ends of the cell groups and the plurality of terminals by detecting a voltage drop or a current decrement at the connection points of the plurality of cells of the cell groups and at one end of the cell groups in the plurality of cells of the cell groups, and generates a second alarm signal.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

A description is given below, with reference to the FIG. 1 and FIG. 2, of embodiments of the present invention.

Where the same reference symbols are attached to the same parts, repeated description of the parts is omitted.

<Circuit Structure>

Figure 1:
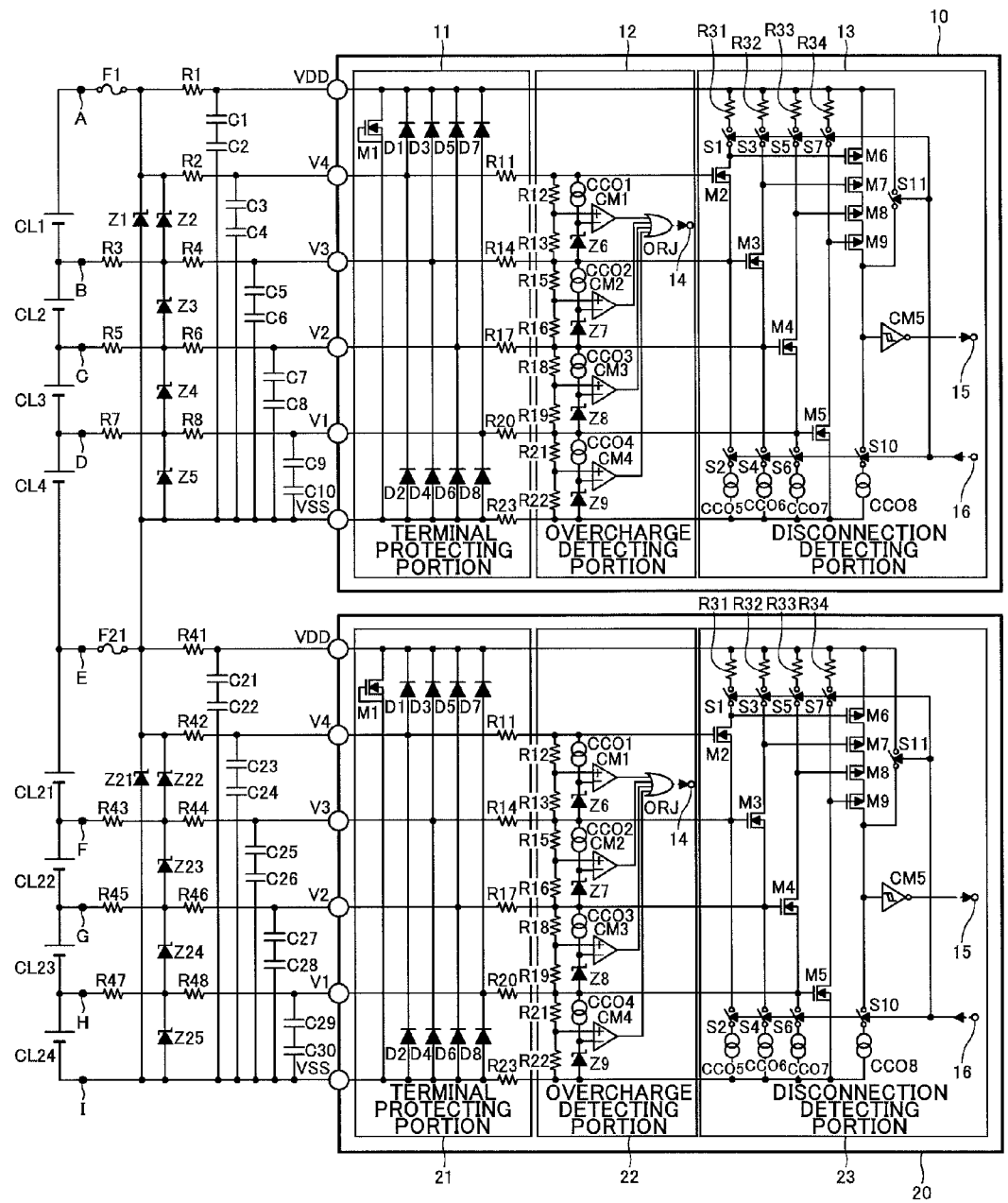
FIG. 1 illustrates a circuit structure of an embodiment of a protection IC of the present invention.
Figure 2:
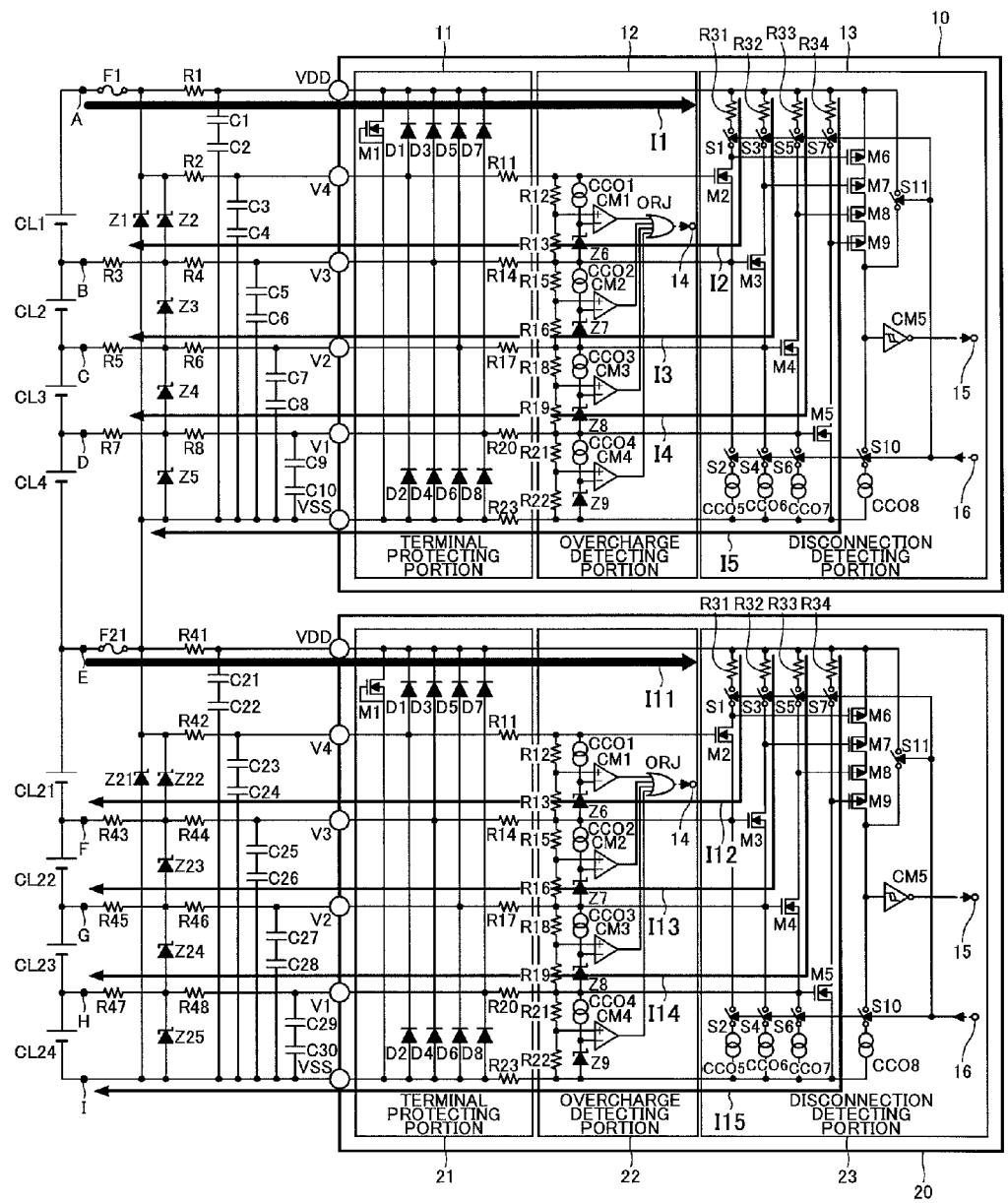
FIG. 2 illustrates a current flowing through the protection IC in a test mode.

FIG. 1 illustrates a circuit structure of an embodiment of a protection IC of the present invention. Referring to FIG. 1, cells CL1 to CL4 of a lithium ion battery being a secondary battery are connected in series to form a first cell group, and cells CL21 to CL24 of a lithium ion battery being a secondary battery are connected in series to form a second cell group. Further, the cell CL4 is connected to the cell CL21 in series to form a secondary battery assembly.

A positive terminal of the cell CL1 is connected to a terminal VDD of a protection IC 10 through a fuse F1 and a resistor R1. A negative terminal of the cell CL4 is connected to the positive terminal of the cell CL21 and an end of a fuse F21. The other end of the fuse F21 is connected to a terminal VSS of the protection IC 10 and a terminal VDD of the protection IC 20 through a resistor R41.

A zener diode Z1 is connected between the connection point, which exists between the fuse F1 and a resistor R1, and a terminal VSS of the protection IC 10. The connection point between the fuse F1 and the resistor R1 is connected to a terminal V4 of the protection IC 10. The connection point between the cells CL1 and CL2 is connected to a terminal V3 of the protection IC 10 through resistors R3 and R4. The connection point between the cells CL2 and CL3 is connected to a terminal V2 of the protection IC 10 through resistors R5 and R6. The connection point between the cells CL3 and CL4 is connected to a terminal V1 of the protection IC 10 through resistors R7 and R8. A zener diode Z2 for electrostatic protection is connected between the connection point, which exists between the resistors R1 and R2, and the connection point, which exists between the resistors R3 and R4. A zener diode Z3 for electrostatic protection is connected between the connection point, which exists between the resistors R3 and R4, and the connection point, which exists between the resistors R5 and R6. A zener diode Z4 for electrostatic protection is connected between the connection point, which exists between the resistors R5 and R6, and the connection point, which exists between the resistors R7 and R8. A zener diode Z5 for electrostatic protection is connected between the connection point, which exists between the resistors R7 and R8, and the terminal VSS of the protection IC 10.

The terminals VDD and VSS of the protection IC 10 are positive and negative power source terminals. The terminals V4, V3, V2, and V1 of the protection IC 10 are voltage detecting terminals. The terminal VDD of the protection IC 10 is connected to the terminal VSS of the protection IC 10 through capacitors C1 and C2. The resistor R1 and the capacitors C1 and C2 form a filter for removing noise. The terminal V4 of the protection IC 10 is connected to the terminal VSS of the protection IC 10 through capacitors C3 and C4. The resistor R2 and the capacitors C3 and C4 form a filter for removing noise. The terminal V3 of the protection IC 10 is connected to the terminal VSS of the protection IC 10 through capacitors C5 and C6. The resistors R3 and R4 and the capacitors C5 and C6 form a filter for removing noise. The terminal V2 of the protection IC 10 is connected to the terminal VSS of the protection IC 10 through capacitors C7 and C8. The resistors R5 and R6 and the capacitors C7 and 08 form a filter for removing noise. The terminal V1 of the protection IC 10 is connected to the terminal VSS of the protection IC 10 through capacitors C9 and C10. The resistors R7 and R8 and the capacitors C9 and C10 form a filter for removing noise.

The positive terminal of the cell CL 21 is connected to the terminal VDD of the protection IC 20 through the fuse F21 and the resistor R41. The negative terminal of the cell CL 24 is connected to a terminal VSS. A zener diode Z21 for protection is connected between a connection point, which exists between the fuse F21 and the resistor R41, and the terminal VSS of the protection IC 20. The connection point, which exists between the fuse F21 and the resistor R41, is connected to a terminal V4 of the protection IC 20 through a resistor R42. A connection point between the cells CL21 and CL22 is connected to a terminal V3 of the protection IC 20 through resistors R43 and R44. A connection point between the cells CL22 and CL23 is connected to a terminal V2 of the protection IC 20 through resistors R45 and R46. A connection point between the cells CL23 and CL24 is connected to a terminal V1 of the protection IC 20 through resistors R47 and R48.

A zener diode Z22 is connected between the connection point, which exists between the resistors R41 and R42, and the connection point, which exists between the resistors R43 and R44. A zener diode Z23 is connected between the connection point, which exists between the resistors R43 and R44, and the connection point, which exists between the resistors R45 and R46. A zener diode Z24 is connected between the connection point, which exists between the resistors R45 and R46, and the connection point, which exists between the resistors R47 and R48. A zener diode Z25 is connected between the connection point, which exists between the resistors R47 and R48, and the terminal VSS of the protection IC 20.

The terminals VDD and VSS of the protection IC 20 are positive and negative power source terminals. The terminals V4, V3, V2, and V1 of the protection IC 20 are voltage detecting terminals. The terminal VDD of the protection IC 20 is connected to the terminal VSS of the protection IC 20 through capacitors C21 and C22. The resistor R41 and the capacitors C21 and C22 form a filter for removing noise. The terminal V4 of the protection IC 20 is connected to the terminal VSS of the protection IC 20 through capacitors C23 and C24. The resistor R42 and the capacitors C23 and C24 form a filter for removing noise. The terminal V3 of the protection IC 20 is connected to the terminal VSS of the protection IC 20 through capacitors C25 and C26. The resistors R43 and R44 and capacitors C25 and C26 form a filter for removing noise. The terminal V2 of the protection IC 20 is connected to the terminal VSS of the protection IC 20 through the capacitors C27 and C28. The resistors R45 and R46 and the capacitors C27 and C28 form a filter for removing noise. The terminal V1 of the protection IC 20 is connected to the terminal VSS of the protection IC 20 through capacitors C29 and C30. The resistors R47 and R48 and the capacitors C29 and C30 form a filter for removing noise.

<Structure of Terminal Protecting Portion>

The protection ICs 10 and 20 are a semiconductor integrated circuit which monitors each of a plurality of cells forming a cell group. The protection IC 10 includes a terminal protecting portion 11, an overcharge detecting portion 12, and a disconnection detecting portion 13. The protection IC 20 includes a terminal protecting portion 21, an overcharge detecting portion 22, and a disconnection detecting portion 23. Because the structure of the protection IC 10 and the structure of the protection IC 20 are the same, reference symbols of electronic components inside the protection IC 20 are provided with the same reference symbols of electronic components inside the protection IC 10, and description of these electronic components is omitted.

In the terminal protecting portion 11, the source and the gate of a n-channel MOS transistor M1 is connected to the terminal VSS, and the drain of the n-channel MOS transistor M1 is connected to the terminal VDD. A diode D1 connects the terminal V4 to the terminal VDD in the forward direction. A diode D2 connects the terminal VSS to the terminal V4 in the forward direction. A diode D3 connects the terminal V3 to the terminal VDD in the forward direction. A diode D4 connects the terminal VSS to the terminal V3 in the forward direction. A diode D5 connects the terminal V2 to the terminal VDD in the forward direction. A diode D6 connects the terminal VSS to the terminal V2 in the forward direction. A diode D7 connects the terminal V1 to the terminal VDD in the forward direction. A diode D8 connects the terminal VSS to the terminal V1 in the forward direction. The terminals V4, V3, V2, V1, and VSS are connected to the overcharge detecting portion 12 and the disconnection detecting portion 13 through resistors R11, R14, R17, R20, and R22, respectively.

Here, in a case where noise having a high voltage is instantaneously input into the terminal VDD, the MOS transistor M1 is broken down to protect the terminal VDD. In a case where noise having a high voltage is instantaneously input in the terminal V4, the noise is applied to the MOS transistor M1 through the diode D1 and the MOS transistor M1 is broken down to protect the terminal V4.

<Structure of Overcharge Detecting Portion>

In the overcharge detecting portion 12, the other ends of the resistors R11 and R14, which are connected to the terminals V4 and V3 at one ends, are connected by the resistors R12 and R13. The connection point between the resistors R12 and R13 is connected to a noninverting input terminal of a comparator CM1. Further, the other ends of the resistors R11 and R14 are connected by a current generator CC01 and a zener diode Z6. The connecting point between the current generator CC01 and the zener diode Z6 is connected to an inverting input terminal of the comparator CM1. The comparator CM1 compares a divided voltage obtained by dividing the voltage between the terminals V3 and V4 using the resistors R12 and R13 with a reference voltage generated by the zener diode Z6. In a case where the divided voltage is higher than the reference voltage, the comparator CM1 generates a detection signal having a high level and supplies it to an OR circuit ORJ.

The other ends of the resistors R14 and R17, which are connected to the terminals V3 and V2 at one end, are connected by the resistors R15 and R16. The connection point between the resistors R15 and R16 is connected to a noninverting input terminal of a comparator CM2. Further, the other ends of the resistors R14 and R17 are connected by a current generator CC02 and a zener diode Z7. The connecting point between the current generator CC02 and the zener diode Z7 is connected to an inverting input terminal of the comparator CM2. The comparator CM2 compares a divided voltage obtained by dividing the voltage between the terminals V2 and V3 using the resistors R15 and R16 with a reference voltage generated by the zener diode Z7. In a case where the divided voltage is higher than the reference voltage, the comparator CM2 generates a detection signal having a high level and supplies it to an OR circuit ORJ.

The other ends of the resistors R17 and R20, which are connected to the terminals V2 and V1 at one end, are connected by the resistors R18 and R19. The connection point between the resistors R18 and R19 is connected to a noninverting input terminal of a comparator CM3. Further, the other ends of the resistors R17 and R20 are connected by a current generator CC03 and a zener diode Z8. The connecting point between the current generator CC03 and the zener diode Z8 is connected to an inverting input terminal of the comparator CM3. The comparator CM3 compares a divided voltage obtained by dividing the voltage between the terminals V1 and V2 using the resistors R18 and R19 with a reference voltage generated by the zener diode Z7. In a case where the divided voltage is higher than the reference voltage, the comparator CM3 generates a detection signal having a high level and supplies it to an OR circuit ORJ.

The other ends of the resistors R20 and R23, which are connected to the terminals V1 and VSS at one end, are connected by the resistors R21 and R22. The connection point between the resistors R21 and R22 is connected to a noninverting input terminal of a comparator CM4. Further, the other ends of the resistors R20 and R23 are connected by a current generator CC04 and a zener diode Z9. The connecting point between the current generator CC04 and the zener diode Z9 is connected to an inverting input terminal of the comparator CM4. The comparator CM4 compares a divided voltage obtained by dividing the voltage between the terminals VSS and V1 using the resistors R21 and R22 with a reference voltage generated by the zener diode Z9. In a case where the divided voltage is higher than the reference voltage, the comparator CM4 generates a detection signal having a high level and supplies it to an OR circuit ORJ.

In a case where a signal having the high level is supplied from any one to the comparator CM1 to CM4, the OR circuit OR1 generates an overcharge alarm signal having the high level and supplies the overcharge alarm signal having the high level from the terminal to a control logic (not illustrated) from a terminal 14.

<Structure of Disconnection Detecting Portion>

In the disconnection detecting portion 13, the gate of a n-channel MOS transistor M2 is connected to the terminal V4 through the resistor R11. The drain of the n-channel MOS transistor M2 is connected to the terminal VDD through a switch S1 and a resistor R31. The source of the n-channel MOS transistor M2 is connected to one end of the current generator CC05 through a switch S2. The other end of the current generator CC05 is connected to the terminal VSS through the resistor R23.

The gate of a n-channel MOS transistor M3 is connected to the terminal V3 through the resistor R14. The drain of the n-channel MOS transistor M3 is connected to the terminal VDD through a switch S3 and a resistor R32. The source of the n-channel MOS transistor M3 is connected to one end of the current generator CC06 through a switch S4. The other end of the current generator CC06 is connected to the terminal VSS through the resistor R23.

The gate of a n-channel MOS transistor M4 is connected to the terminal V2 through the resistor R17. The drain of the n-channel MOS transistor M4 is connected to the terminal VDD through a switch S5 and a resistor R33. The source of the n-channel MOS transistor M4 is connected to one end of the current generator CC07 through a switch S6. The other end of the current generator CC07 is connected to the terminal VSS through the resistor R23.

The gate of a n-channel MOS transistor M5 is connected to the terminal V1 through the resistor R20. The drain of the n-channel MOS transistor M5 is connected to the terminal VDD through a switch S7 and a resistor R34. The source of the n-channel MOS transistor M5 is connected to the terminal VSS through the resistor R23.

Further, the drains of the n-channel MOS transistors M2 to M5 are connected to the gates of the p-channel MOS transistors M6, M7, M8, and M9, which are longitudinally arranged, respectively. The source of the p-channel MOS transistor M6 on the uppermost stage among the p-channel MOS transistors M6, M7, M8, and M9 is connected to the terminal VDD. The drain of the p-channel MOS transistor M9 on the lowermost stage among the p-channel MOS transistors M6, M7, M8, and M9 is connected to an end of a current generator CC08 through a switch S18. The other end of the current generator CC08 is connected to the terminal VSS through the resistor R23. Both ends of a switch S11 are connected to the source of the p-channel MOS transistor M6 at the uppermost stage and the drain of the p-channel MOS transistor M9 at the lowermost stage, respectively. In this, the p-channel MOS transistors, which are longitudinally arranged, have a structure such that the source of a p-channel MOS transistor is connected to the drain of another p-channel MOS transistor.

Further, the source of the MOS transistor M9 is connected to an input terminal of a Schmidt trigger circuit CM5. The Schmidt trigger circuit CM5 generates a disconnection detection alarm signal having the high level when any one of the p-channel MOS transistors M6 to M9 is switched off and supplies the disconnection detection alarm signal from a terminal 15 to the control logic (not illustrated). In the control logic, when the disconnection detection alarm signal having the high level is supplied, charging is prohibited.

A mode signal having a high level for instructing a test mode is supplied by the control logic (not illustrated) to a terminal 16. This mode signal is supplied to the switches S1 to S11. For example, the mode signal has the high level for only several tens msec at a time of power-on in order to instruct the disconnection detecting portion 13 to perform the test mode. During this term, disconnection is detected, a disconnection detection alarm signal is generated, and the generated disconnection detection alarm signal is supplied to the control logic (not illustrated). Thus, because the disconnection is temporarily detected, power consumption for detecting the disconnection can be reduced.

The switches S1 to S10 turn on in receipt of the mode signal having the high level, and the switch S11 turns off in receipt of the mode signal having the high level. When the mode signal has the low level under an ordinary mode, the switch S11 turns on to make the input of the input of the Schmidt trigger circuit CM5 have the high level and therefore the output of the Schmidt trigger circuit CM5 is made to have the low level.

Under the test mode, the switches S1 to S8 are turned on. Therefore, if there is no disconnection, electric currents flow as illustrated in FIG. 2. In the protection IC 10, a current I1 flows through the fuse F1, the resistor R1, the terminal VDD to the resistors R31 to R34. The current I1 shunts into currents I2, I3, and I4. The current I2 flows through a path including the resistor R31, the switch S1, the MOS transistor M2, the resistor R14, the terminal V3, and the resistors R4 and R3. The current I3 flows through a path including the resistor R32, the switch S3, the MOS transistor M3, the resistor R17, the terminal V2, and the resistors R6 and R5. The current I4 flows through a path including the resistor R33, the switch S5, the MOS transistor M4, the resistor R20, the terminal V1, and the resistors R8 and R7. The current I5 flows through a path including the resistor R34, the switch S7, the MOS transistor M5, the resistor R23, and the terminal VSS.

In the protection IC 20, a current I11 flows through the fuse F21, the resistor R41, the terminal VDD to the resistors R31 to R34. The current I11 shunts into currents I12, I13, and I14. The current I12 flows through a path including the resistor R31, the switch S1, the MOS transistor M2, the resistor R14, the terminal V3, and the resistors R4 and R3. The current I13 flows through a path including the resistor R32, the switch S3, the MOS transistor M3, the resistor R17, the terminal V2, and the resistors R6 and R5. The current I4 flows through a path including the resistor R33, the switch S5, the MOS transistor M4, the resistor R20, the terminal V1, and the resistors R8 and R7. The current I5 flows through a path including the resistor R34, the switch S7, the MOS transistor M5, the resistor R23, and the terminal VSS.

<Detection of No Disconnection>

A portion at which disconnection is detected in connections between the first cell group, including the cells CL1 to CL4, and the protection IC 10, is at connection points A, B, C, and D for connecting the cells CL1 to CL4, the fuse F1, and the resistors R3, R5, and R7. A portion at which disconnection is detected in connections between the second cell group, including the cells CL21 to CL24, and the protection IC 20, is at connection points E, F, G, H, and I for connecting the cells CL21 to CL24, the fuse F21, and the resistors R43, R45, and R47.

In a case where there is no disconnection in all the points A to I, the MOS transistors M2 to M5 of the MOS transistor protection IC 10 are turned on, and the MOS transistors M6 to M9 are turned on. Therefore, the low level is output from the terminal 15.

<Detection of Disconnection in A>

In a case where the disconnection occurs in the point A, a current flows into the terminals VDD and V4 from the terminal V3 of the protection IC 10 through the zener diode Z2 and the diode D3. In this case, because the source voltage of the re-channel MOS transistor M2 becomes higher than the gate voltage of the n-channel MOS transistor M2 between the terminals V4 and V3, the n-channel MOS transistor M2 is turned off. Therefore, the drain voltage of the MOS transistor M2 becomes high and the gate-source voltage Vgs becomes small, and the MOS transistor M6 turns off. With this, a disconnection detection alarm signal having the high level is output from the terminal 15.

<Detection of Disconnection in B to D and F to H>

In a case where the disconnection occurs in the point B, the current I2 does not flow from the terminal V3 of the protection IC 10. Therefore, the drain current of the MOS transistor M2 becomes only a current flown from the current generator CC05, and which is very small, to thereby make the gate-source voltage Vgs of the MOS transistor M2 small. Therefore, the drain voltage of the MOS transistor M2 becomes high, the voltage drop in the resistor R31 becomes small, and the gate-source voltage Vgs of the MOS transistor M6 becomes small to thereby turn off the MOS transistor M6. Therefore, the disconnection detection alarm signal having the high level is output from the terminal 15 of the protection IC 10.

In a case where the disconnection occurs in the point C, the current I3 does not flow from the terminal V2 of the protection IC 10. Therefore, the drain current of the MOS transistor M3 becomes only a current flown from the current generator CC05, and which is very small, to thereby make the gate-source voltage Vgs of the MOS transistor M3 small. Therefore, the drain voltage of the MOS transistor M3 becomes high, the voltage drop in the resistor R32 becomes small, and the gate-source voltage Vgs of the MOS transistor M7 becomes small to thereby turn off the MOS transistor M7. Therefore, the disconnection detection alarm signal having the high level is output from the terminal 15 of the protection IC 10.

In a case where the disconnection occurs in the point D, the current I4 does not flow from the terminal V1 of the protection IC 10. Therefore, the drain current of the MOS transistor M4 becomes only a current flown from the current generator CC05, and which is very small, to thereby make the gate-source voltage Vgs of the MOS transistor M4 small. Therefore, the drain voltage of the MOS transistor M4 becomes high, the voltage drop in the resistor R33 becomes small, and the gate-source voltage Vgs of the MOS transistor M8 becomes small to thereby turn off the MOS transistor M8. Therefore, the disconnection detection alarm signal having the high level is output from the terminal 15 of the protection IC 10.

In a case where the disconnection occurs in the point F, the current I12 does not flow from the terminal V3 of the protection IC 20. Therefore, the drain current of the MOS transistor M2 becomes only a current flown from the current generator CC05, and which is very small, to thereby make the gate-source voltage Vgs of the MOS transistor M2 small. Therefore, the drain voltage of the MOS transistor M2 becomes high, the voltage drop in the resistor R31 becomes small, and the gate-source voltage Vgs of the MOS transistor M6 becomes small to thereby turn off the MOS transistor M6. Therefore, the disconnection detection alarm signal having the high level is output from the terminal 15 of the protection IC 20.

In a case where the disconnection occurs in the point G, the current I13 does not flow from the terminal V2 of the protection IC 20. Therefore, the drain current of the MOS transistor M3 becomes only a current flown from the current generator CC05, and which is very small, to thereby make the gate-source voltage Vgs of the MOS transistor M3 small. Therefore, the drain voltage of the MOS transistor M3 becomes high, the voltage drop in the resistor R32 becomes small, and the gate-source voltage Vgs of the MOS transistor M7 becomes small to thereby turn off the MOS transistor M7. Therefore, the disconnection detection alarm signal having the high level is output from the terminal 15 of the protection IC 20.

In a case where the disconnection occurs in the point H, the current I14 does not flow from the terminal V1 of the protection IC 20. Therefore, the drain current of the MOS transistor M4 becomes only a current flown from the current generator C005, and which is very small, to thereby make the gate-source voltage Vgs of the MOS transistor M4 small. Therefore, the drain voltage of the MOS transistor M4 becomes high, the voltage drop in the resistor R33 becomes small, and the gate-source voltage Vgs of the MOS transistor M8 becomes small to thereby turn off the MOS transistor M8. Therefore, the disconnection detection alarm signal having the high level is output from the terminal 15 of the protection IC 20.

<Detection of Disconnection in E>

In a case where the disconnection occurs in the point E, the current I11 flowing into the terminal VDD of the protection IC 20 is only the current I5 supplied from the terminal VSS of the protection IC 10. Because the current I11 flowing into the terminal VDD of the protection IC 20 is sufficiently greater than the current I5, the voltage of the terminal VDD, namely the voltage of the terminal V4, becomes small, and the gate-source voltage Vgs of the MOS transistor M2 becomes small to thereby turn off the MOS transistor M2. Therefore, the drain voltage of the MOS transistor M2 becomes high, and the gate-source voltage Vgs of the MOS transistor M6 becomes small to thereby turn off the MOS transistor M6. Therefore, the disconnection detection alarm signal having the high level is output from the terminal 15 of the protection IC 20.

As described above, disconnection between the cell group and the protection IC in the point E, at which the cell groups are connected in series.

<Detection of Disconnection in I>

In a case where the disconnection occurs in the point I, the current I15 of the protection IC 20 flows into the point H through the zener diode Z25 or the diode D8. Therefore, the voltage of the terminal V1 of the protection IC 20 becomes higher than the voltage of the terminal VSS by the voltage drop in the forward direction to thereby turn off the MOS transistor M5. Therefore, the drain voltage of the MOS transistor M5 becomes high, and the gate-source voltage Vgs of the MOS transistor M9 becomes small to thereby turn off the MOS transistor M9. Thus, the disconnection detection alarm signal having the high level is output from the terminal 15.

<Detection of Cell Short>

In a case where a cell short where both ends of the cell CL2 short occurs, the voltage between the V3 and V2 terminals becomes 0V. In this case, the MOS transistor M3 is turned off. Therefore, the drain voltage of the MOS transistor M3 increases, the gate-source voltage Vgs of the MOS transistor M7 becomes small to thereby turn off the MOS transistor M7. Therefore, the disconnection detection alarm signal having the high level is output from the terminal 15 is output to enable detection of the cell short.

Although, in the embodiment, the first cell group and the second cell group are connected in series, it is not limited to this connection by the embodiment. Disconnection in the points A to I of the cell groups can be detected even if the number of cell groups connected in series is 3 or greater.

As described, according to the embodiment of the present invention, disconnection between the cell groups and the protection IC at a position where the cell groups are connected in series can be detected.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the protection IC has been described in detail, it should be understood that various changes, substitutions, and alterations could be made hereto without departing from the spirit and scope of the invention.

What is claimed is:

1. A protection IC which is connected to cell groups of a secondary battery assembly formed by connecting a plurality of cell groups, in which a plurality of cells of a secondary battery are connected in series, and monitors battery voltages of the plurality of cells in the cell groups, the protection IC comprising:
   a plurality of terminals which are connected to connection points of the plurality of cells in the cell groups and both ends of the cell groups;
   a first alarm generating portion which detects an overvoltage by comparing voltages of the plurality of cells of the cell groups on both ends of the plurality of cells and generates a first alarm signal; and
   a second alarm generating portion which detects disconnection in connection points of the plurality of cells of the cell groups and and the both ends of the cell groups and the plurality of terminals by detecting a voltage drop or a current decrement at the connection points of the plurality of cells of the cell groups and at one end of the cell groups in the plurality of cells of the cell groups, and generates a second alarm signal, and includes
   a plurality of first transistors, each of which drain is connected to a terminal connected to one end of the cell groups through a resistor, each of which source is connected to a terminal connected to another end of the cell groups through a current generator, and each of which gate is connected to the connection point of the plurality of cells of the cell groups and an end of the cell groups, the first transistor causes a drain current to be decreased, the drain current being decreased by a voltage drop or a current decrement in the plurality of connection points of the cell groups and an end of the cell groups,
   a plurality of second transistors which are arranged in series between the terminals connected to the both ends of the cell groups, each of which gate is connected to the drains of the first transistors, and which is turned off due to the decrement of the drain current, and
   a second logical circuit which generates the second alarm signal by turning off at least one of the plurality of second transistors.

2. The protection IC according to claim 1, further comprising:
   a terminal protecting portion formed by connecting the plurality of terminals, which are connected to the connection points of the plurality of cells of the cell groups and to the both ends of the cell groups through diodes.

3. The protection IC according to claim 1, further comprising:
   a switch for supplying an operating current to the second alarm generating portion under a test mode.

4. A method of monitoring battery voltages of a plurality of cells connected in series to form a plurality of cell groups connected in series so as to be used as a secondary battery assembly, the method of monitoring the battery voltages comprising:
   providing a plurality of terminals which are connected to connection points of the plurality of cells in the cell groups and both ends of the cell groups;

detecting an overvoltage by comparing voltages of the plurality of cells of the cell groups on both ends of the plurality of cells and generating a first alarm signal; and detecting disconnection in connection points of the plurality of cells of the cell groups and disconnection between the both ends of the cell groups and the plurality of terminals by detecting a voltage drop or a current decrement at the connection points of the plurality of cells of the cell groups and at one end of the cell groups in the plurality of cells of the cell groups, and generating a second alarm signal, wherein the generating of the second alarm signal includes connecting a plurality of first transistors, each of which drain is connected to a terminal connected to one end of the cell groups through a resistor, each of which source is connected to a terminal connected to another end of the cell groups through a current generator, and each of which gate is connected to the connection point of the plurality of cells of the cell groups and an end of the cell groups, the first transistor causes a drain current of the plurality of the first transistors to be decreased, the drain current being decreased by a voltage drop or a current decrement in the plurality of connection points in the plurality of the cells of the cell groups, and arranging a plurality of second transistor circuits in series between the terminals connected to the both ends of the cell groups, each of which gate is connected to the drains of the first transistors, and which are turned off due to a decrement of the drain currents of the plurality of the first transistors, and generating the second alarm signal by turning off at least one of the plurality of second transistors.

5. The method of monitoring the battery voltages according to claim 4,
wherein the plurality of terminals, which are connected to the connection points of the plurality of cells of the cell groups and to the both ends of the cell groups, are connected through diodes.

6. The method of monitoring the battery voltages according to claim 4,
wherein, in the generating the second alarm signal, an operating current is supplied under a test mode.

* * * * *